US012750997B2

(12) United States Patent
Kwon

(10) Patent No.: US 12,750,997 B2
(45) Date of Patent: Sep. 29, 2026

(54) SEMICONDUCTOR MEMORY DEVICE AND METHOD OF PRODUCING SAME

(71) Applicant: CHANGXIN MEMORY TECHNOLOGIES, INC., Hefei City (CN)

(72) Inventor: Joon Mo Kwon, Hefei (CN)

(73) Assignee: ChangXin Memory Technologies, Inc., Hefei (CN)

( * ) Notice: Subject to any disclaimer, the term of this patent is extended or adjusted under 35 U.S.C. 154(b) by 1085 days.

(21) Appl. No.: 17/386,443

(22) Filed: Jul. 27, 2021

(65) Prior Publication Data

US 2021/0358917 A1 Nov. 18, 2021

Related U.S. Application Data

(63) Continuation of application No. PCT/CN2021/084439, filed on Mar. 31, 2021.

(30) Foreign Application Priority Data

Apr. 8, 2020 (CN) ......................... 202010267452.1

(51) Int. Cl.
*H10B 12/00* (2023.01)

(52) U.S. Cl.
CPC ....... *H10B 12/315* (2023.02); *H10B 12/0335* (2023.02)

(58) Field of Classification Search
CPC ....... H01L 23/64; H01L 28/90; H10B 12/033; H10B 12/0335; H10B 12/315; H10N 97/00; H10D 1/716; H10W 44/00
See application file for complete search history.

(56) References Cited

U.S. PATENT DOCUMENTS

| | | | |
|---|---|---|---|
| 6,613,629 | B2 | 9/2003 | Kim |
| 2003/0032238 | A1 | 2/2003 | Kim |

(Continued)

FOREIGN PATENT DOCUMENTS

| | | | |
|---|---|---|---|
| CN | 102117776 | A | 7/2011 |
| CN | 108336068 | A | 7/2018 |

(Continued)

OTHER PUBLICATIONS

International Search Report in the international application No. PCT/CN2021/084439, mailed on Jul. 2, 2021, 2 pgs.

*Primary Examiner* — Meiya Li
(74) *Attorney, Agent, or Firm* — Intellectual Valley Law, P.C.

(57) ABSTRACT

A method of producing a semiconductor memory device includes following operations. A substrate is provided. A stacked structure is formed on the substrate. Capacitor holes arranged at intervals are formed in the stacked structure. Bottom electrode layers are formed in the capacitor holes. A top-layer dielectric layer is removed. A first capacitor dielectric layer is formed on exposed surfaces of a sacrificial layer and surfaces of upper parts of the bottom electrode layers. A first top electrode layer is formed on a surface of the first capacitor dielectric layer. Multiple openings are formed in the first top electrode layer and first capacitor dielectric layer. The sacrificial layer is removed through the openings. A second capacitor dielectric layer is formed. A second top electrode layer is formed on a surface of the second capacitor dielectric layer.

13 Claims, 17 Drawing Sheets

(56) References Cited

U.S. PATENT DOCUMENTS

| | | | | |
|---|---|---|---|---|
| 2010/0155802 | A1* | 6/2010 | Ohuchi | H10B 12/0335 257/306 |
| 2021/0272959 | A1* | 9/2021 | Kim | H10B 12/033 |
| 2021/0296322 | A1* | 9/2021 | Lee | H10B 12/31 |

FOREIGN PATENT DOCUMENTS

| | | | |
|---|---|---|---|
| CN | 109148426 | A | 1/2019 |
| CN | 110970401 | A | 4/2020 |
| CN | 210296415 | U | 4/2020 |
| CN | 112802746 | A | 5/2021 |
| KR | 20040050796 | A | 6/2004 |

* cited by examiner

SEMICONDUCTOR MEMORY DEVICE AND METHOD OF PRODUCING SAME

CROSS-REFERENCE TO RELATED APPLICATIONS

The present application is a U.S. continuation application of International Application No. PCT/CN2021/084439, filed on Mar. 31, 2021, which claims priority to Chinese Patent Application No. 202010267452.1, filed on Apr. 8, 2020. International Application No. PCT/CN2021/084439 and Chinese Patent Application No. 202010267452.1 are incorporated herein by reference in their entireties.

TECHNICAL FIELD

The present disclosure relates to the technical field of manufacturing of semiconductor devices, in particular, to a semiconductor memory device and a method of producing the same.

BACKGROUND

With the development of semiconductor processes, semiconductor process nodes become smaller and smaller. Graphical structures (for example, capacitor structures) in a Dynamic Random Access Memory (DRAM) are accelerating miniaturization. As the size of a capacitor hole becomes smaller and smaller, it is difficult to prepare a capacitor structure including a bottom electrode layer, a capacitor dielectric layer, and a top electrode layer in the capacitor hole by the existing technology. In this context, a columnar capacitor will be used to replace the capacitor structure in the existing DRAM. However, the columnar capacitor has the problem of low capacitance.

SUMMARY

According to various embodiments, a semiconductor memory device and a method for producing the same are provided.

A method for producing a semiconductor memory device includes the following operations: providing a substrate; forming a stacked structure on the substrate, the stacked structure including a bottom-layer dielectric layer, a sacrificial layer and a top-layer dielectric layer which are superposed in sequence from bottom to top; forming a plurality of capacitor holes arranged at intervals in the stacked structure, the capacitor holes penetrating through the stacked structure and exposing the substrate; forming a bottom electrode layer in each of the capacitor holes, the bottom electrode layer filling up each of the capacitor holes; removing the top-layer dielectric layer to expose the sacrificial layer and an upper part of the bottom electrode layer; forming a first capacitor dielectric layer on an exposed surface of the sacrificial layer and a surface of the upper part of the bottom electrode layer; forming a first top electrode layer on a surface of the first capacitor dielectric layer; forming a plurality of openings in the first top electrode layer and the first capacitor dielectric layer, the openings exposing the sacrificial layer; removing the sacrificial layer through the openings; forming a second capacitor dielectric layer at least on a surface of the bottom electrode layer and an exposed surface of the bottom-layer dielectric layer; and forming a second top electrode layer on a surface of the second capacitor dielectric layer.

In the above-mentioned embodiment, the top-layer dielectric layer that serves as a supporting layer is removed after the formation of the bottom electrode layer and before the removal of the sacrificial layer, and the first capacitor dielectric layer and the first top electrode layer are formed at the position where the removed top-layer dielectric layer is located, so that the formed first capacitor dielectric layer and first top electrode layer can play a role of a supporting layer and can also form a capacitor with the bottom electrode layer to increase the capacitance of a columnar capacitor.

In one of the embodiments, each of the openings simultaneously overlaps several of the capacitor holes.

In one of the embodiments, the substrate includes a base and a coverage dielectric layer on a surface of the base. The stacked structure is provided on a surface of the coverage dielectric layer. A plurality of storage node contacts are formed in the coverage dielectric layer. The capacitor holes expose the storage node contacts.

In one of the embodiments, the second capacitor dielectric layer further extends via the openings to cover an upper surface of the first top electrode layer. The second top electrode layer fills up a gap between adjacent two of the bottom electrode layers and extends via the openings to cover the second capacitor dielectric layer on the upper surface of the first top electrode layer.

In one of the embodiments, after formation of the second top electrode layer, the method further includes an operation of forming an electrode lead-out structure. The electrode lead-out structure penetrates through the second capacitor dielectric layer provided on the upper surface of the first top electrode layer and the second top electrode layer provided on the first top electrode layer and extends into the first top electrode layer.

In one of the embodiments, after formation of the second top electrode layer, the method further includes the following operations.

The second capacitor dielectric layer on the upper surface of the first top electrode layer and the second top electrode layer provided on the first top electrode layer are removed to expose the first top electrode layer.

An interconnection conductive layer is formed on a surface of the first top electrode layer and a surface of the second top electrode layer. The interconnection conductive layer electrically connects the first top electrode layer to the second top electrode layer.

In one of the embodiments, after formation of the interconnection conductive layer, the method further includes an operation of forming an electrode lead-out structure. The electrode lead-out structure is electrically connected to the interconnection conductive layer.

In one of the embodiments, the forming a first top electrode layer on a surface of the first capacitor dielectric layer includes the following operations. A first conductive layer is formed on the surface of the first capacitor dielectric layer. A second conductive layer is formed on a surface of the first conductive layer.

A semiconductor memory device is further provided. The semiconductor memory device includes a substrate and a plurality of capacitors. Each of the capacitors includes a bottom electrode layer, a first capacitor dielectric layer, a second capacitor dielectric layer, a first top electrode layer, and a second top electrode layer. The bottom electrode layer is of a columnar structure. The second capacitor dielectric layer at least wraps a surface of lower and middle parts of the bottom electrode layer and is at least located between the second top electrode layer and the bottom electrode layer as well as between the second top electrode layer and the substrate. The first capacitor dielectric layer is located on an upper surface of at least part of the second top electrode layer and an upper part of the bottom electrode layer. The first top electrode layer is located on an upper surface of the first capacitor dielectric layer.

In the above-mentioned embodiment, the first capacitor dielectric layer and the first top electrode layer are provided on the upper part of the bottom electrode layer and on the second top electrode layer, so that the first capacitor dielectric layer and first top electrode layer can play a role of supporting layers and can also form the capacitors with the bottom electrode layers to increase the capacitance of a columnar capacitor.

In one of the embodiments, the substrate includes a base and a coverage dielectric layer on a surface of the base. A plurality of storage node contacts are formed in the coverage dielectric layer. Each of the bottom electrode layers is connected to each of the storage node contacts respectively.

In one of the embodiments, the semiconductor memory device further includes a plurality of opening portions. Each of the opening portions simultaneously overlaps several of the bottom electrode layers. The second capacitor dielectric layer further extends via the opening portions to cover an upper surface of the first top electrode layer. The second top electrode layer fills up a gap between adjacent two of the bottom electrode layers and extends via the opening portions to cover the second capacitor dielectric layer located on an upper surface of the first top electrode layer.

In one of the embodiments, the semiconductor memory device further includes an electrode lead-out structure. The electrode lead-out structure penetrates through the second capacitor dielectric layer located on the upper surface of the first top electrode layer and the second top electrode layer located on the first top electrode layer and extends into the first top electrode layer.

In one of the embodiments, the semiconductor memory device further includes a plurality of opening portions and an interconnection conductive layer. Each of the opening portions penetrates through the first top electrode layer and the first capacitor dielectric layer and simultaneously overlaps several of the bottom electrode layers. The second capacitor dielectric layer is further located on side walls of the opening portions. The second top electrode layer fills up a gap between two of the adjacent bottom electrode layers and extends into the opening portions. The interconnection conductive layer covers the first top electrode layer and the second top electrode layer which is bare and electrically connects the first top electrode layer to the second top electrode layer.

In one of the embodiments, the semiconductor memory device further includes an electrode lead-out structure. The electrode lead-out structure is electrically connected to the interconnection conductive layer.

In one of the embodiments, the first top electrode layer includes a first conductive layer located on the surface of the first capacitor dielectric layer and a second conductive layer located on a surface of the first conductive layer.

DETAILED DESCRIPTION

For convenience of an understanding of the present disclosure, the present disclosure will now be described more detailed below with reference to the related drawings. A preferred embodiment of the present disclosure is shown in the accompanying drawings. The present disclosure may, however, be implemented in many different variants and is not limited to the embodiments described herein. Rather, these embodiments are provided so that the disclosed content of the present disclosure will be more detailed and comprehensive.

It should be noted that when one element is referred to as being "connected" to another element, it can be directly connected to and integrated with the other element in one piece or an intermediate element may exist therebetween. The terms used herein such as "mounted", "one end", and "the other end" are only for the purpose of illustration.

Unless defined otherwise, all technical and scientific terms used herein have the same meaning as commonly understood by those skilled in the art to which the present application pertains. The terms used herein in the specification of the present disclosure are merely for the purpose of describing specific embodiments and are not intended to limit the present disclosure. The term "and/or" used herein includes any and all combinations of one or more related listed items.

Figure 1:
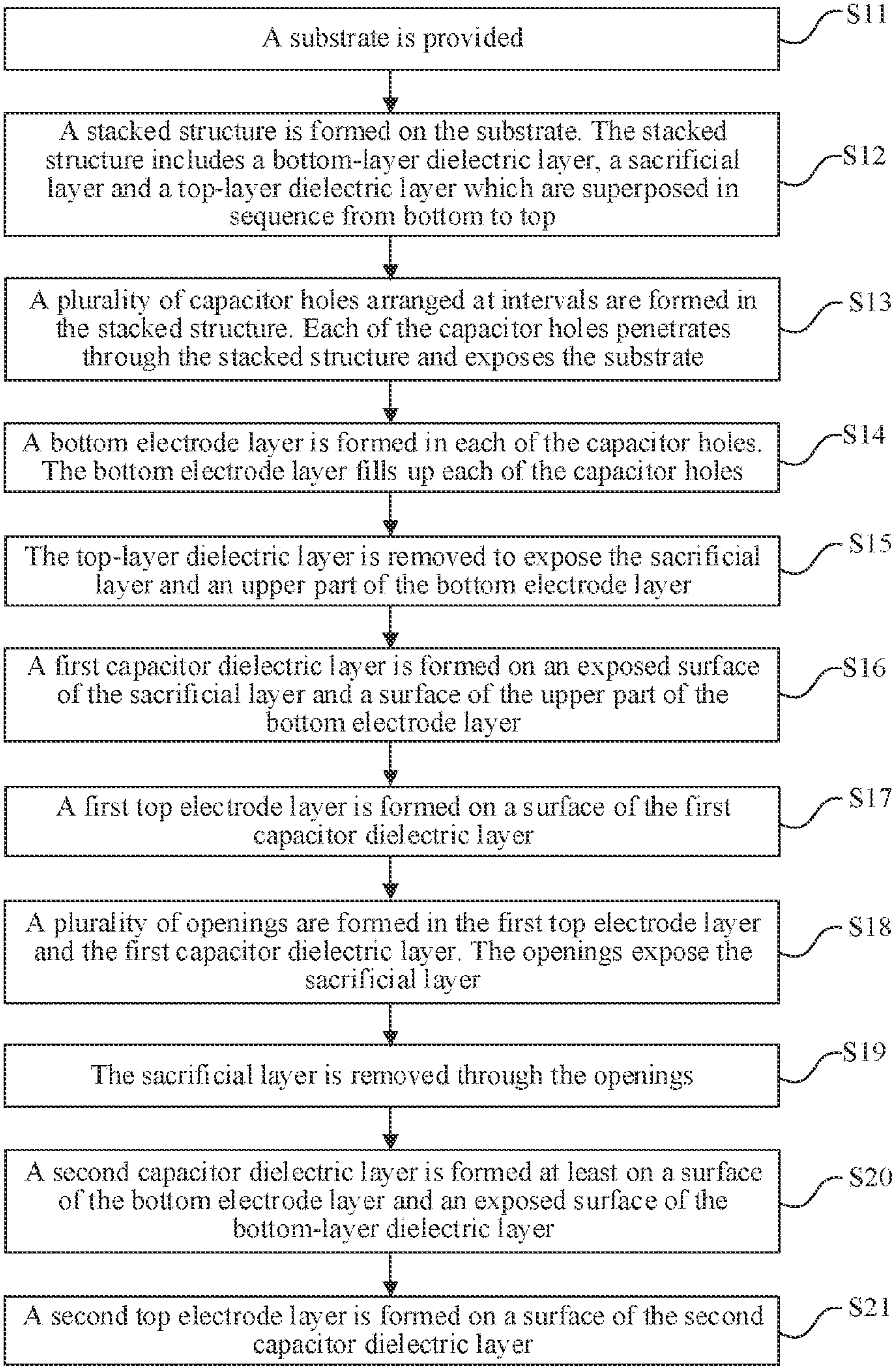
FIG. 1 is a flowchart of a method of producing a semiconductor memory device according to an embodiment.

In one embodiment, as shown in FIG. 1, a method of producing a semiconductor memory device includes the following operations.

S11: a substrate is provided.

S12: a stacked structure is formed on the substrate. The stacked structure includes a bottom-layer dielectric layer, a sacrificial layer and a top-layer dielectric layer which are superposed in sequence from bottom to top.

S13: a plurality of capacitor holes arranged at intervals are formed in the stacked structure. Each of the capacitor holes penetrates through the stacked structure and exposes the substrate.

S14: a bottom electrode layer is formed in each of the capacitor holes. The bottom electrode layer fills up each of the capacitor holes.

S15: the top-layer dielectric layer is removed to expose the sacrificial layer and an upper part of the bottom electrode layer.

S16: a first capacitor dielectric layer is formed on an exposed surface of the sacrificial layer and a surface of the upper part of the bottom electrode layer.

S17: a first top electrode layer is formed on a surface of the first capacitor dielectric layer.

S18: a plurality of openings are formed in the first top electrode layer and the first capacitor dielectric layer. The openings expose the sacrificial layer.

S19: the sacrificial layer is removed through the openings.

S20: a second capacitor dielectric layer is formed at least on a surface of the bottom electrode layer and an exposed surface of the bottom-layer dielectric layer.

S21: a second top electrode layer is formed on a surface of the second capacitor dielectric layer.

Figure 2:
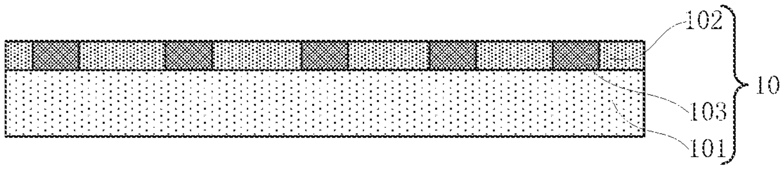
FIG. 2 is a schematic cross-sectional view of a structure obtained at operation S11 in a method of producing a semiconductor memory device according to an embodiment.

In one example, as shown in FIG. 2, the substrate 10 provided at operation S11 may include a base 101 and a coverage dielectric layer 102 on the surface of the base 101. A plurality of storage node contacts 103 in a storage structure are formed in the coverage dielectric layer 102. Specifically, the storage structure further includes transistor word lines and bit lines. The storage node contact 103 is connected to a source of the transistor in the storage structure.

Figure 3:
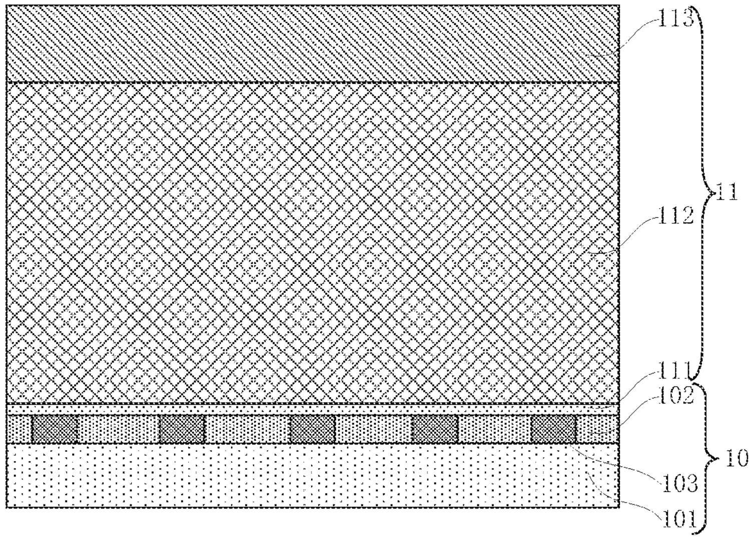
FIG. 3 is a schematic cross-sectional view of a structure obtained at operation S12 in a method of producing a semiconductor memory device according to an embodiment.

In one example, as shown in FIG. 3, at operation S12, the bottom-layer dielectric layer 111, the sacrificial layer 112 and the top-layer dielectric layer 113 in the stacked structure 11 can be formed in sequence by using a physical vapor deposition process, a chemical vapor deposition process or an atomic layer deposition process.

In one example, at least under a certain same etching condition, the removal rate of the sacrificial layer 112 will be much greater than the removal rate of the bottom-layer dielectric layer 111 and the removal rate of the top-layer dielectric layer 113. Specifically, the bottom-layer dielectric layer 111 may include, but not limited to, a silicon nitride layer. The sacrificial layer 112 may include, but not limited to, a silicon oxide layer. The top-layer dielectric layer 113 may include, but not limited to, a silicon nitride layer.

Figure 4:
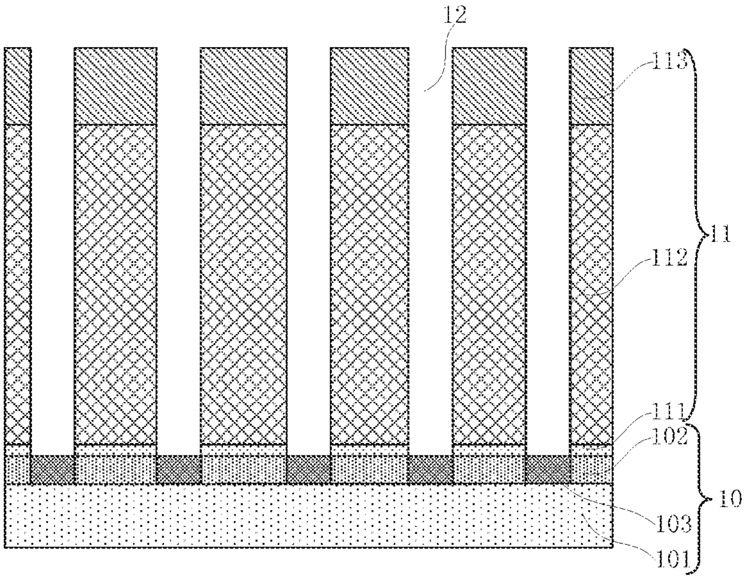
FIG. 4 is a schematic cross-sectional view of a structure obtained at operation S13 in a method of producing a semiconductor memory device according to an embodiment.

In one example, as shown in FIG. 4, at operation S13, a photoetching process can be used to form the capacitor holes 12 in the stacked structure 11. Each of the capacitor holes 12 penetrates through the stacked structure 11 in a thickness direction. The capacitor holes 12 may be arranged in an array, such as a hexagonal array. The capacitor holes 12 expose the storage node contacts 103.

In one example, operation S14 may include the following operations.

S141: a bottom electrode material layer (not shown) is formed in the capacitor holes 12 and on the surface of the top-layer dielectric layer 113. Specifically, the bottom electrode material layer may be formed by using, but not limited to, the physical vapor deposition process, the chemical vapor deposition process or the atomic layer deposition process. The bottom electrode material layer may be a single-layer metal layer. For example, the bottom electrode material layer may include, but not limited to, a titanium nitride layer. In other examples, the bottom electrode material layer may also be a multi-layer conductive layer. For example, the bottom electrode material layer may include a titanium nitride layer and a polycrystalline silicon layer or a germanium-silicon layer on the surface of the titanium nitride layer;

S142: the bottom electrode material layer on the surface of the top-layer dielectric layer 113 is removed, and the bottom electrode material layer in the capacitor holes 12 is retained to serve as the bottom electrode layer. Specifically, an etching back process or a Chemical Mechanical Polishing (CMP) process can be used to remove the bottom electrode material layer on the surface of the top-layer dielectric layer 113.

Figure 5:
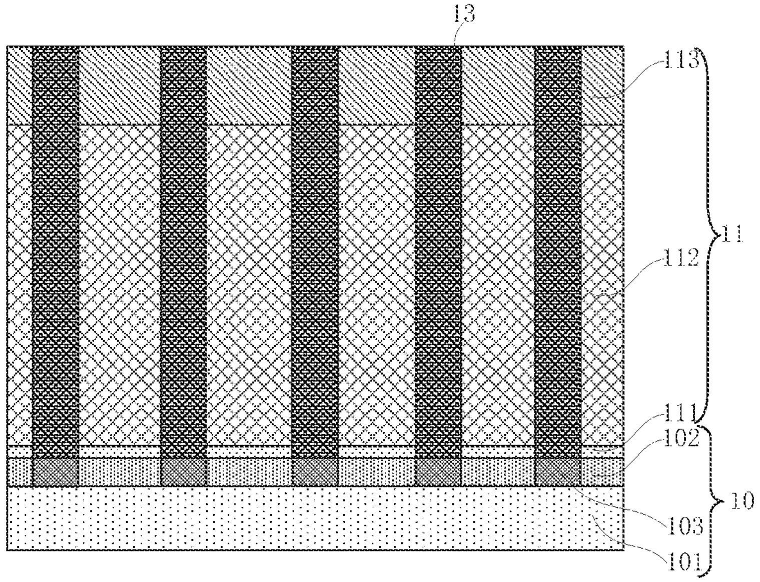
FIG. 5 is a schematic cross-sectional view of a structure obtained at operation S14 in a method of producing a semiconductor memory device according to an embodiment.

In one example, the upper surface of the bottom electrode layer 13 may be flush with the upper surface of the top-layer dielectric layer 113 (as shown in FIG. 5), or may be slightly higher or lower than the upper surface of the top-layer dielectric layer 113.

It should be noted that the "the bottom electrode layer 13 fills up each of the capacitor holes 12" at operation S14 means that the bottom electrode layer 13 seamlessly fills up each of the capacitor holes 12, or that the bottom electrode layer 13 filled in each of the capacitor holes 12 has holes inside because of relatively small sizes of the capacitor holes 12.

In one example, at operation S15, the top-layer dielectric layer 113 may be removed by using, but not limited to, an etching process. After the top-layer dielectric layer 113 is removed, the upper part of the bottom electrode layer 13 and the upper surface of the sacrificial layer 112 are exposed.

Figure 6:
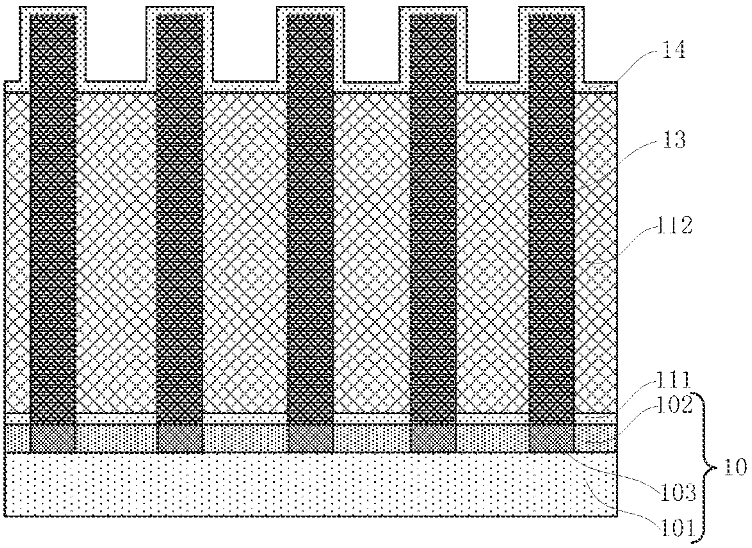
FIG. 6 is a schematic cross-sectional view of a structure obtained at operation S16 in a method of producing a semiconductor memory device according to an embodiment.

In one example, at operation S16, as shown in FIG. 6, specifically, the first capacitor dielectric layer 14 may be formed by using the physical vapor deposition process, the chemical vapor deposition process or the atomic layer deposition process. The first capacitor dielectric layer 14 may include, but not limited to, one or a combination of more of zirconia, alumina, a silicon oxide layer, a silicon nitride layer or a silicon oxynitride layer, etc., and may be other high-K dielectric materials. No limitation is made in this regard.

In one example, operation S17 may include the following operations.

Figure 7:
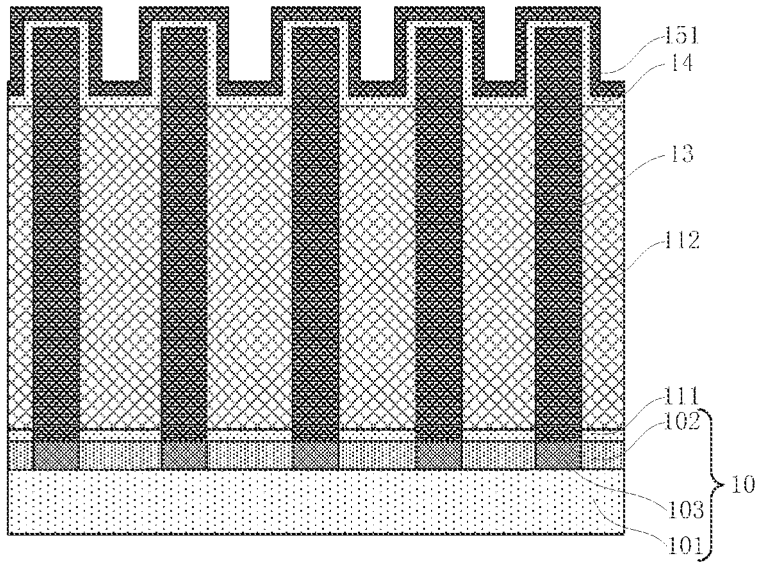
FIG. 7 to FIG. 8 are schematic cross-sectional views of a structure obtained at operation S17 in a method of producing a semiconductor memory device according to an embodiment.

S171: a first conductive layer 151 is formed on the surface of the first capacitor dielectric layer 14, as shown in FIG. 7. Specifically, the first conductive layer 151 may be formed by using the physical vapor deposition process, the chemical vapor deposition process or the atomic layer deposition process. The first conductive layer 151 may include, but not limited to, a titanium nitride layer.

Figure 8:
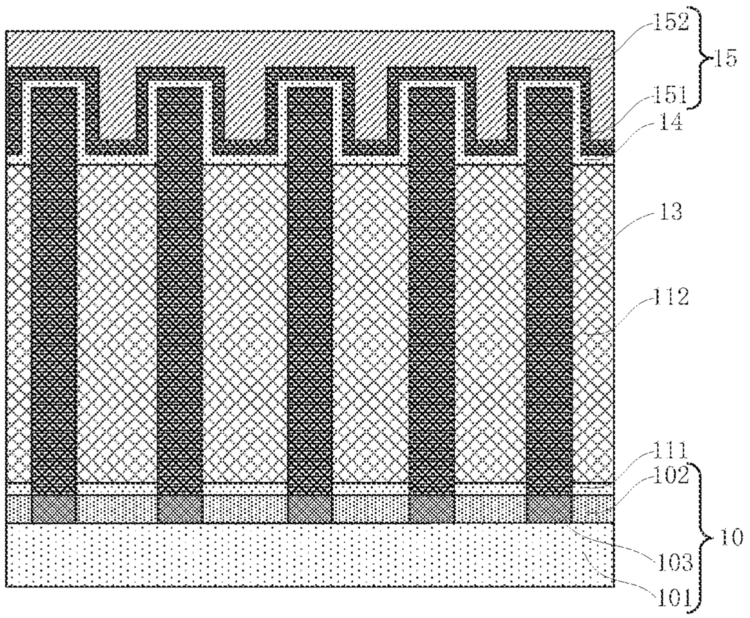

S172: a second conductive layer 152 is formed on the surface of the first conductive layer 151, as shown in FIG. 8. Specifically, the second conductive layer 152 may be formed by using the physical vapor deposition process, the chemical vapor deposition process or the atomic layer deposition process. The second conductive layer 152 may include, but not limited to, a germanium-silicon (SiGe) layer. The first conductive layer 151 and the second conductive layer 152 together constitute the first top electrode layer 15. Of course, those skilled in the art should understand that one conductive layer may also be used as the first top electrode layer 15, which can be arranged according to requirements.

In the above-mentioned embodiment, the top-layer dielectric layer 113 that serves as a supporting layer is removed after the formation of the bottom electrode layer 13 and before the removal of the sacrificial layer 112, and the first capacitor dielectric layer 14 and the first top electrode layer 15 are formed at the position where the removed top-layer dielectric layer 113 is located, so that the formed first capacitor dielectric layer 14 and first top electrode layer 15 can play a role of a supporting layer and can also form a capacitor with the bottom electrode layer 13 to increase the capacitance of a columnar capacitor.

Figure 9:
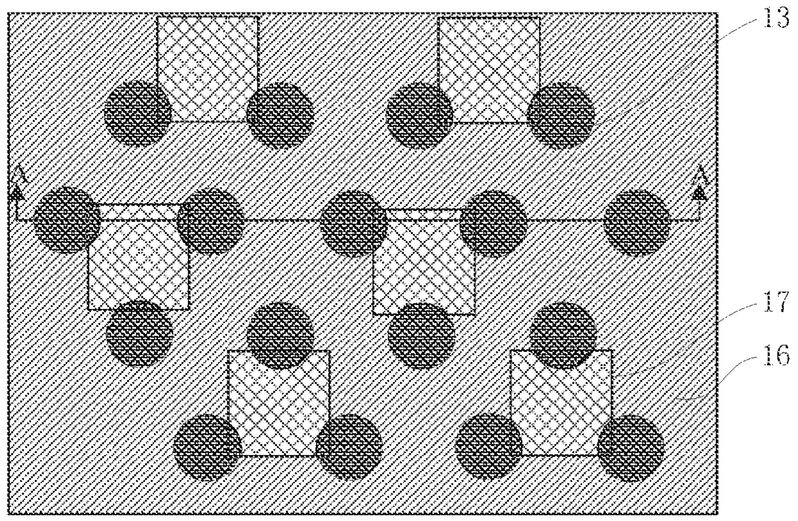
FIG. 9 is a schematic top view of a structure obtained at operation S18 in a method of producing a semiconductor memory device according to an embodiment.
Figure 10:
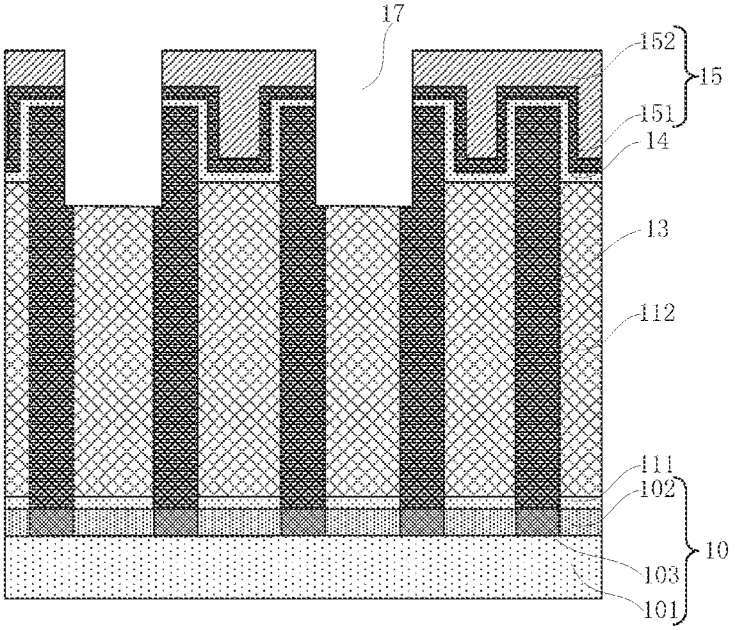
FIG. 10 is a schematic structural diagram of a cross section in a direction AA in FIG. 9.

In one example, as shown in FIG. 9 and FIG. 10, at operation S18, the openings 17 may be formed by using a photoetching process. Each of the openings 17 may penetrate through the second conductive layer 152, the first conductive layer 151 and the first capacitor dielectric layer 14 till the sacrificial layer 112 is exposed.

In one example, each of the openings 17 may simultaneously overlap several of the capacitor holes 12. In FIG. 9, one opening 17 simultaneously overlapping three capacitor holes 12 is taken as an example. Of course, in other examples, the number of capacitor holes 12 that one opening 17 simultaneously overlap can be set according to an actual requirement. No limitation is made here.

Specifically, the cross section of each of the openings 17 may be rectangular, circular, elliptical, triangular, etc.

In one example, the diameter of each of the openings 17 may be greater than a spacing distance between adjacent two of the bottom electrode layers 13. That is, after the formation of the openings 17, the upper parts of some of the bottom electrode layers 13 will be partially removed, as shown in FIG. 10. Of course, in other examples, the positions and shapes of the openings 17 may be set according to requirements. Alternatively, each of the openings may not overlap the capacitor holes 12. The openings can be used in the present disclosure as long as they expose the sacrificial layer.

Figure 11:
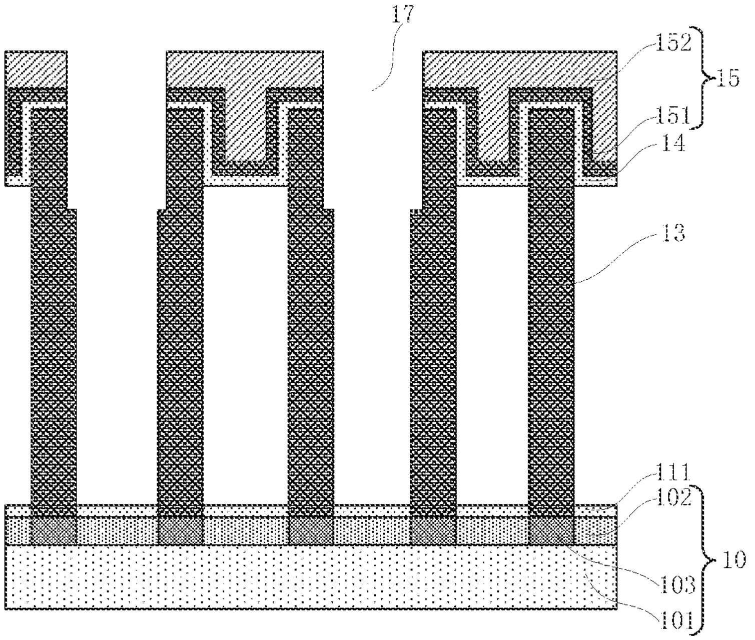
FIG. 11 is a schematic cross-sectional view of a structure obtained at operation S19 in a method of producing a semiconductor memory device according to an embodiment.

In one example, as shown in FIG. 11, at operation S19, the sacrificial layer 112 may be removed through the openings 17 by using, but not limited to, a wet removal solution.

Figure 12:
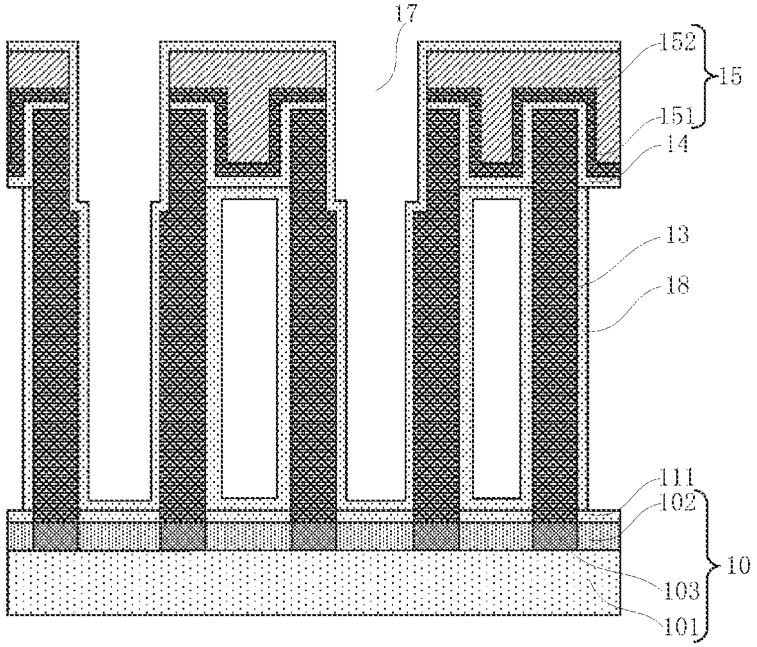
FIG. 12 is a schematic cross-sectional view of a structure obtained at operation S20 in a method of producing a semiconductor memory device according to an embodiment.

In one example, as shown in FIG. 12, at operation S20, the second capacitor dielectric layer 18 can be formed by using the physical vapor deposition process, the chemical vapor deposition process or the atomic layer deposition process. The second capacitor dielectric layer 18 wraps all the exposed surface of the bottom electrode layer 13. The second capacitor dielectric layer 18 may include, but not limited to, one or a combination of more of zirconia, alumina, a silicon oxide layer, a silicon nitride layer or a silicon oxynitride layer, etc., and may be other high-K dielectric materials. No limitation is made in this regard.

In one example, the second capacitor dielectric layer 18 is provided on the side walls of the openings 17 and the upper surface of the second conductive layer 152 in addition to wrapping all the exposed surface of the bottom electrode layer 13 and the exposed surface of the bottom-layer dielectric layer 111, as shown in FIG. 12.

Figure 13:
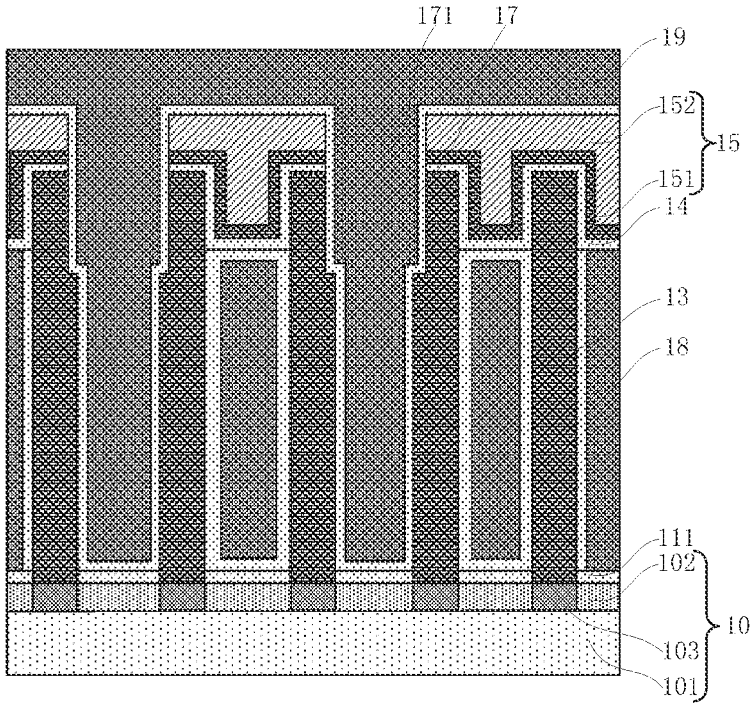
FIG. 13 is a schematic cross-sectional view of a structure obtained at operation S21 in a method of producing a semiconductor memory device according to an embodiment.

In one optional example, at operation S21, the second top electrode layer 19 may be formed on the surface of the second capacitor dielectric layer 18 by using the physical vapor deposition process, the chemical vapor deposition process or the atomic layer deposition process. The second top electrode layer 19 fills up the gap between adjacent two of the bottom electrode layers 13 and extends via the openings 17 to cover the second capacitor dielectric layer 18 on the upper surface of the second conductive layer 152, as shown in FIG. 13. It should be noted that the "the second top electrode layer 19 fills up the gap between adjacent two of the bottom electrode layers 13" here means that the second top electrode layer 19 seamlessly fills up the gap between adjacent two of the bottom electrode layers 13, or that the second top electrode layer 19 filled in the gap between adjacent two of the bottom electrode layers 13 has holes inside.

Figure 14:
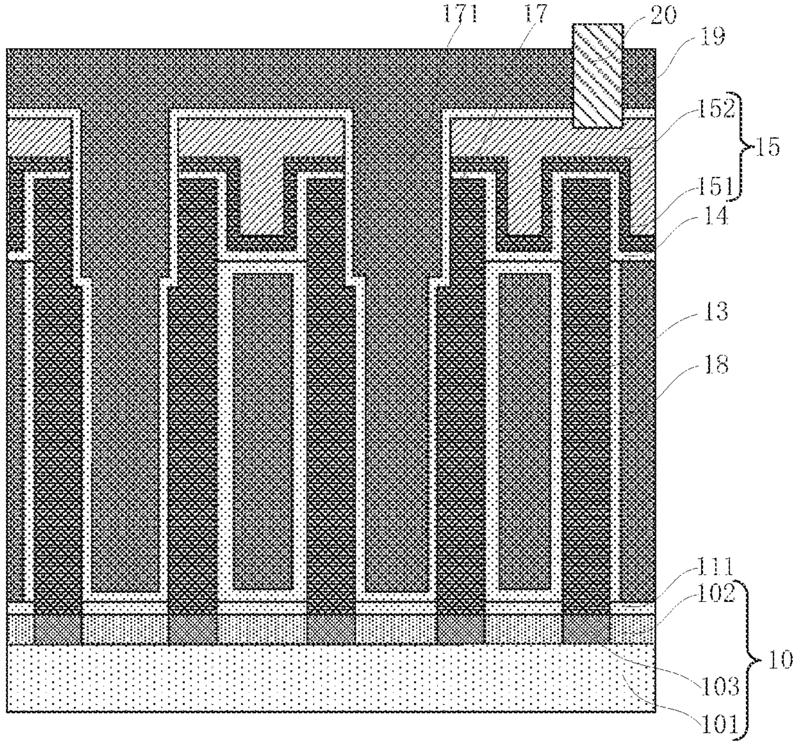
FIG. 14 is a schematic cross-sectional view of a structure obtained after formation of an electrode lead-out structure in one embodiment of a method of producing a semiconductor memory device according to an embodiment.

In one example, after the formation of the second top electrode layer 19, the method further includes an operation of forming an electrode lead-out structure 20, as shown in FIG. 14. The electrode lead-out structure 20 penetrates through the second capacitor dielectric layer 18 on the upper surface of the second conductive layer 152 and the second top electrode layer 19 on the second conductive layer 152 and extends into the second conductive layer 152. The electrode lead-out structure 20 is configured to electrically lead out the electrode layers in addition to electrically connecting the first top electrode layer 15 to the second top electrode layer 19. The electrode lead-out structure 20 may include, but not limited to, a titanium nitride lead-out structure, a tungsten lead-out structure, and other lead-out structures.

Figure 15:
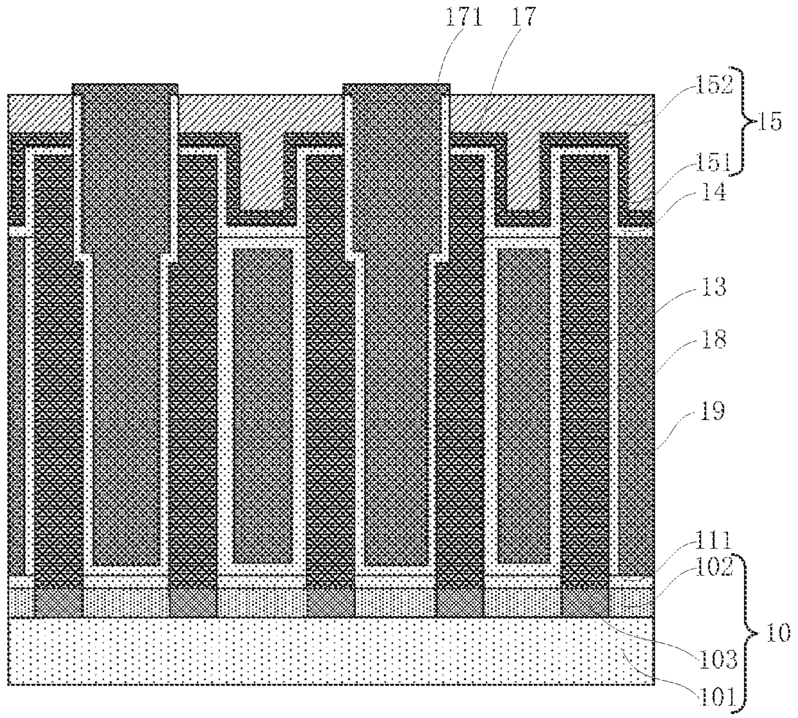
FIG. 15 is a schematic cross-sectional view of a structure obtained after removal of a second capacitor dielectric layer on an upper surface of a second conductive layer and a second top electrode layer located on a second conductive layer in a method of producing a semiconductor memory device according to an embodiment.
Figure 16:
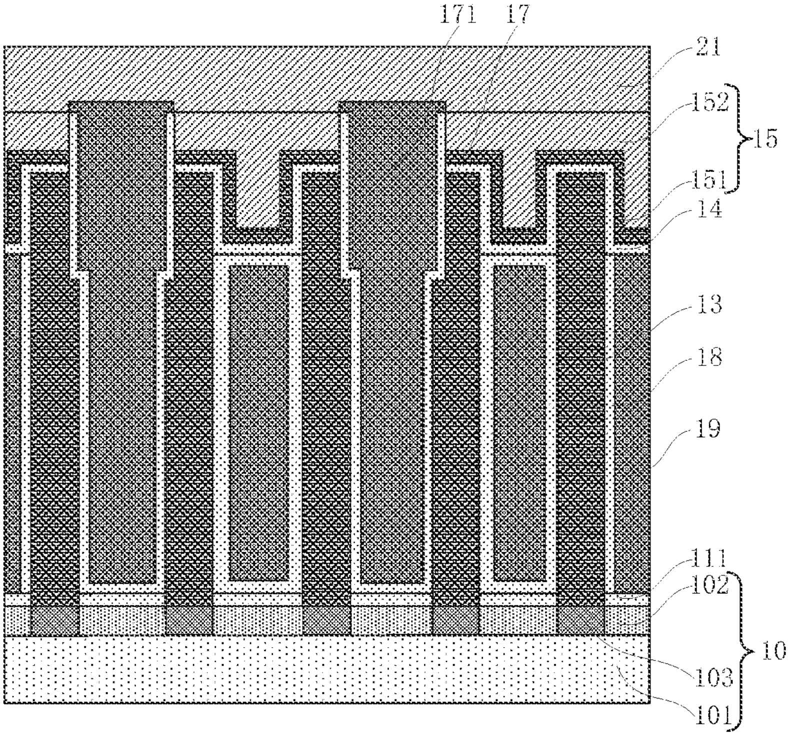
FIG. 16 is a schematic cross-sectional view of a structure obtained after formation of an interconnection conductive layer in a method of producing a semiconductor memory device according to an embodiment.

In another example, as shown in FIG. 15 and FIG. 16, after the formation of the second top electrode layer 19, the method further includes the following operations.

S22: the second capacitor dielectric layer 18 on the upper surface of the second conductive layer 152 and the second top electrode layer 19 on the second conductive layer 152 are removed to expose the second conductive layer 152, as shown in FIG. 15. Specifically, the second capacitor dielectric layer 18 on the upper surface of the second conductive layer 152 and the second top electrode layer 19 on the second conductive layer 152 may be removed by using the etching process or the chemical mechanical polishing process.

S23: an interconnection conductive layer 21 is formed on the surface of the second conductive layer 152 and the surface of the second top electrode layer 19, as shown in FIG. 16. The interconnection conductive layer 21 electrically connects the first top electrode layer 15 to the second top electrode layer 19. Specifically, the interconnection conductive layer 21 may be formed by using, but not limited to, the physical vapor deposition process, the chemical vapor deposition process or the atomic layer deposition process. The interconnection conductive layer 21 may include, but not limited to, a germanium-silicon layer.

Figure 17:
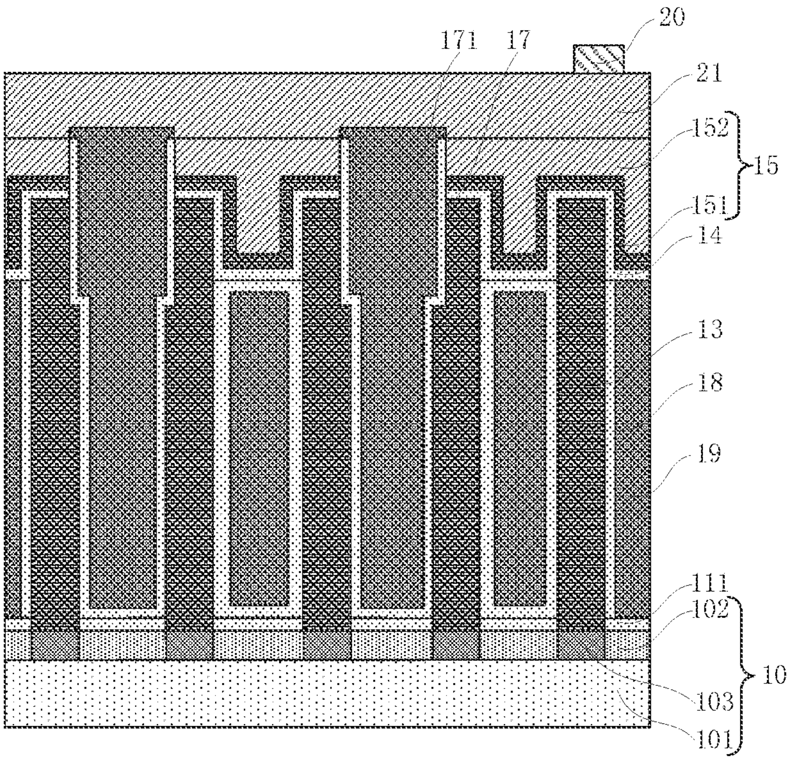
FIG. 17 is a schematic cross-sectional view of a structure obtained after formation of an electrode lead-out structure in another embodiment of a method of producing a semiconductor memory device according to an embodiment.

In one example, as shown in FIG. 17, after the formation of the interconnection conductive layer 21, the method further includes an operation of forming an electrode lead-out structure 20. The electrode lead-out structure 20 may be provided on the upper surface of the interconnection conductive layer 21. The electrode lead-out structure 20 penetrates through the interconnection conductive layer 21 and extends into the second conductive layer 152. The electrode lead-out structure 20 may include, but not limited to, a titanium nitride lead-out structure.

In a further embodiment, referring to FIG. 13 to FIG. 14 in combination with FIG. 2 to FIG. 12, the disclosure further provides a semiconductor memory device. The semiconductor memory device includes a substrate 10 and a plurality of capacitors. The capacitors include a bottom electrode layer 13, a first capacitor dielectric layer 14, a second capacitor dielectric layer 18, a first top electrode layer 15, and a second top electrode layer 19. The bottom electrode layer 13 is of a columnar structure. The second capacitor dielectric layer 18 at least wraps the surface of the lower and middle part of the bottom electrode layer 13 and is at least provided between the second top electrode layer 19 and the bottom electrode layer 13 as well as between the second top electrode layer 19 and the substrate 10. The first capacitor dielectric layer 14 is provided on an upper surface of at least part of the second top electrode layer 19 and the upper part of the bottom electrode layer 13. The first top electrode layer 15 is provided on an upper surface of the first capacitor dielectric layer 14.

In the above-mentioned embodiment, the first capacitor dielectric layer 14 and the first top electrode layer 15 are provided at the upper part of the bottom electrode layer 13 and on the second top electrode layer 19, so that the first capacitor dielectric layer 14 and first top electrode layer 15 can play a role of a supporting layer and can also form a capacitor with the bottom electrode layer 13 to increase the capacitance of a columnar capacitor.

In one example, the substrate 10 may include a base 101 and a coverage dielectric layer 102 on the surface of the base 101. A plurality of storage node contacts 103 in a memory array structure are formed in the coverage dielectric layer 102. Specifically, the memory array structure further includes transistor word lines and bit lines. The storage node contact 103 is connected to a source of a transistor in the memory array structure.

In one example, the bottom electrode layer 13 may include, but not limited to, a titanium nitride layer.

In one example, the upper surface of the bottom electrode layer 13 may be flush with the upper surface of the top-layer dielectric layer 113, or may be slightly higher or lower than the upper surface of the top-layer dielectric layer 113.

Specifically, the first capacitor dielectric layer 14 and the second capacitor dielectric layer 18 each may include, but not limited to, one or a combination of more of zirconia, alumina, a silicon oxide layer, a silicon nitride layer or a silicon oxynitride layer, etc., and may be other high-K dielectric materials. No limitation is made in this regard.

In one example, the first top electrode layer 15 includes a first conductive layer 151 on the surface of the first capacitor dielectric layer 14 and a second conductive layer 152 on the surface of the first conductive layer 151. The first conductive layer 151 may include, but not limited to, a titanium nitride layer. The second conductive layer 152 may include, but not limited to, a germanium-silicon layer.

In one example, as shown in FIG. 13 and FIG. 14, the semiconductor memory device further includes a plurality of opening portions 171. Each of the opening portions 171 simultaneously overlaps several of the bottom electrode layers 13. The second capacitor dielectric layer 18 also extends via the opening portions 171 to cover the upper surface of the second conductive layer 152. The second top electrode layer 19 fills up the gap between adjacent two of the bottom electrode layers 13 and extends via the opening portions 171 to cover the second capacitor dielectric layer 18 on the upper surface of the second conductive layer 152.

In one example, each of the opening portions 171 may simultaneously overlap several of the capacitor holes 12. In FIG. 9, one opening portion 171 simultaneously overlapping three capacitor holes 12 is taken as an example. Of course, in other examples, the number of capacitor holes 12 that one opening portion 171 simultaneously overlap can be set according to an actual requirement. No limitation is made here.

Specifically, the cross section of each of the opening portions 171 may be rectangular, circular, elliptical, or triangular, etc.

In one example, the diameter of each of the opening portions 171 may be greater than a spacing distance between adjacent two of the bottom electrode layers 13. That is, after the formation of the opening portions 171, the upper parts of part of the bottom electrode layers 13 will be partially removed. Of course, in other examples, the positions and shapes of the opening portions 171 may be set according to requirements. The opening portions can be used in the present disclosure as long as they expose the sacrificial layer.

In one example, the semiconductor memory device further includes an electrode lead-out structure 20. The electrode lead-out structure 20 penetrates through the second capacitor dielectric layer 18 on the upper surface of the second conductive layer 152 and the second top electrode layer 19 on the second conductive layer 152 and extends into the second conductive layer 152. The electrode lead-out structure 20 may include, but not limited to, a titanium nitride lead-out structure.

In another embodiment, as shown in FIG. 16 and FIG. 17, the semiconductor memory device further includes a plurality of opening portions 171 and an interconnection conductive layer 21. Each of the opening portions 171 penetrates through the first conductive layer 151, the second conductive layer 152, and the first capacitor dielectric layer 14, and simultaneously overlaps several of the bottom electrode layers 13. The second capacitor dielectric layer 18 is also provided on the side walls of the opening portions 171. The second top electrode layer 19 fills up the gap between adjacent two of the bottom electrode layers 13 and extends into the opening portions 171. The interconnection conductive layer 21 covers the second conductive layer 152 and the bare second top electrode layer 19. The interconnection conductive layer 21 may include, but not limited to, a germanium-silicon layer.

In one example, as shown in FIG. 17, the semiconductor memory device further includes an electrode lead-out structure 20. The electrode lead-out structure 20 penetrates through the interconnection conductive layer 21 and extends into the second conductive layer 152. The electrode lead-out structure 20 may include, but not limited to, a titanium nitride lead-out structure, a tungsten lead-out structure, and other lead-out structures.

The various technical features of the above-mentioned embodiments can be combined in any way. However, as long as there is no contradiction in the combination of these technical features, the combination should be construed as the scope of the present specification.

The foregoing embodiments represent only a few implementation modes of the present application. The descriptions thereof are specific and detailed. However, they should not be construed as limiting the protection scope of the present application. It should be noted that those of ordinary skill in the art may further make variations and modifications without departing from the conception of the present disclosure. These variations and modifications all fall into the protection scope of the present application. Therefore, the protection scope of the present application should be defined by the appended claims.

The invention claimed is:

1. A method of producing a semiconductor memory device, comprising:

providing a substrate;

forming a stacked structure on the substrate, the stacked structure comprising a bottom-layer dielectric layer, a sacrificial layer and a top-layer dielectric layer which are superposed in sequence from bottom to top;

forming a plurality of capacitor holes arranged at intervals in the stacked structure, each of the plurality of capacitor holes penetrating through the stacked structure and exposing the substrate;

forming a bottom electrode layer in each of the plurality of capacitor holes, the bottom electrode layer filling up each of the plurality of capacitor holes, each bottom electrode layer having a columnar structure;

removing the top-layer dielectric layer to expose the sacrificial layer and an upper part of each bottom electrode layers;

forming a first capacitor dielectric layer on an exposed surface of the sacrificial layer and a top surface and sidewalls of the upper part of each bottom electrode layers;

forming a first top electrode layer on the first capacitor dielectric layer;

forming a plurality of openings extending from the first top electrode layer through the first capacitor dielectric layer to expose the sacrificial layer, wherein each of the plurality of openings simultaneously overlapping at least the two adjacent ones of the bottom electrode layers;

removing the sacrificial layer through the plurality of openings to form a gap between two adjacent ones of the bottom electrode layers;

forming a second capacitor dielectric layer having a first portion on the first top electrode layer, and a second portion on sidewalls of each of the plurality of openings and the gap, and a bottom surface of the gap;

forming a second top electrode layer on the second capacitor dielectric layer, wherein a first portion of the second top electrode layer filling up each of the plurality of openings and the gap, and a second portion of the second top electrode layer protruding from the plurality of openings and overlying the first top electrode layer;

removing the second portion of the second top electrode layer and the first portion of the second capacitor dielectric layer to expose the first top electrode layer; and forming an interconnection conductive layer on the first top electrode layer and the second top electrode layer, wherein the interconnection conductive layer electrically connecting the first top electrode layer to the second top electrode layer.

2. The method of claim 1, wherein the substrate comprising:

a base; and a coverage dielectric layer on the base, wherein the stacked structure is provided on the coverage dielectric layer, a plurality of storage node contacts are formed in the coverage dielectric layer, and the plurality of capacitor holes expose the plurality of storage node contacts respectively.

3. The method of claim 1, further comprising:

forming an electrode lead-out structure penetrating through the interconnection conductive layer and extending into the first top electrode layer.

4. The method of claim 1, further comprising:

forming an electrode lead-out structure to electrically connected to the interconnection conductive layer.

5. The method of claim 1, wherein the forming the first top electrode layer on the first capacitor dielectric layer comprising:

forming a first conductive layer on the first capacitor dielectric layer; and forming a second conductive layer on the first conductive layer.

6. A semiconductor memory device, comprising:

a substrate, a plurality of bottom electrode layers disposed on the substrate, a first capacitor dielectric layer, a second capacitor dielectric layer, a first top electrode layer, and a second top electrode layer, wherein each of the plurality of bottom electrode layers having a columnar structure; and wherein each of the plurality of bottom electrode layers forms a capacitor with a corresponding portion of the first capacitor dielectric layer and a corresponding portion of the first top electrode layer, and forms another capacitor with a corresponding portion of the second capacitor dielectric layer and a corresponding portion of the second top electrode layer;

wherein the second capacitor dielectric layer including a first portion on sidewall surfaces of a lower part and a middle part of each of the plurality of bottom electrode layers and between each of the plurality of bottom electrode layers and the corresponding portion of the second top electrode layer, and a second portion between the second top electrode layer and the substrate;

the first capacitor dielectric layer is located above at least part of the second top electrode layer and covers an upper surface and sidewall surfaces of a top part of each of the plurality of bottom electrode layers, the sidewall surfaces of the top part and the sidewall surfaces of the lower part and the middle part form all sidewall surfaces of each bottom electrode layer;

the first top electrode layer is located on of the first capacitor dielectric layer;

a plurality of opening portions, each of the plurality of opening portions penetrating through the first top electrode layer and the first capacitor dielectric layer and simultaneously overlapping with at least two adjacent ones of the plurality of bottom electrode layers, the second capacitor dielectric layer further covering sidewalls of each of the plurality of opening portions, and the second top electrode layer filling up a gap between the two adjacent ones of the plurality of bottom electrode layers and extending into the plurality of opening portions; and an interconnection conductive layer, the interconnection conductive layer covering the first top electrode layer and covering the second top electrode layer exposed by the first top electrode layer and electrically connecting the first top electrode layer to the second top electrode layer.

7. The semiconductor memory device of claim 6, wherein the substrate comprising:

a base; and a coverage dielectric layer on the base, wherein a plurality of storage node contacts are formed in the coverage dielectric layer, and each of the plurality of bottom electrode layers is connected to each of the plurality of storage node contacts respectively.

8. The semiconductor memory device of claim 6, further comprising:

an electrode lead-out structure penetrating through the interconnection conductive layer and extending into the first top electrode layer.

9. The semiconductor memory device of claim 6, further comprising:

an electrode lead-out structure, wherein the electrode lead-out structure is electrically connected to the interconnection conductive layer.

10. The semiconductor memory device of claim 6, wherein the first top electrode layer comprising:

a first conductive layer located on the first capacitor dielectric layer; and a second conductive layer located on the first conductive layer.

11. The semiconductor memory device of claim 6, wherein the first capacitor dielectric layer and the first top electrode layer configured to support the plurality of bottom electrode layers.

12. The semiconductor memory device of claim 6, wherein of the corresponding portion of the first capacitor dielectric layer is in contact with of another portion of the second capacitor dielectric layer.

13. The semiconductor memory device of claim 6, wherein the first capacitor dielectric layer and the second capacitor dielectric layer are formed in different fabrication steps, and the first top electrode layer and the second top electrode layer are formed in different fabrication steps.

* * * * *